(12) United States Patent
Kameshima

(10) Patent No.: US 7,923,696 B2
(45) Date of Patent: *Apr. 12, 2011

(54) PHOTOELECTRIC CONVERTING APPARATUS

(75) Inventor: Toshio Kameshima, Kumagaya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/544,938

(22) Filed: Aug. 20, 2009

(65) Prior Publication Data
US 2009/0309035 A1    Dec. 17, 2009

Related U.S. Application Data

(62) Division of application No. 10/540,423, filed as application No. PCT/JP2004/017042 on Nov. 10, 2004, now Pat. No. 7,592,599.

(30) Foreign Application Priority Data

Nov. 19, 2003    (JP) .................................. 2003-389274
Jun. 18, 2004    (JP) .................................. 2004-180899

(51) Int. Cl.
H01L 27/146    (2006.01)
H04N 5/335    (2011.01)

(52) U.S. Cl. .................... 250/370.09; 348/301; 348/302

(58) Field of Classification Search ............. 250/370.09; 348/301, 302
See application file for complete search history.

(56) References Cited

U.S. PATENT DOCUMENTS

| | | | |
|---|---|---|---|
| 6,855,937 B2 | 2/2005 | Tashiro et al. | 250/370.11 |
| 6,952,015 B2 | 10/2005 | Kameshima | 250/370.11 |
| 7,002,157 B2 | 2/2006 | Kameshima | 250/370.11 |
| 7,138,639 B2 | 11/2006 | Kameshima | 250/370.11 |
| 7,386,089 B2 | 6/2008 | Endo et al. | 378/5 |
| 7,442,939 B2 | 10/2008 | Yagi et al. | 250/370.11 |
| 7,514,690 B2 | 4/2009 | Endo et al. | 250/370.14 |
| 7,573,038 B2 | 8/2009 | Yokoyama et al. | 250/370.09 |
| 2001/0030704 A1 | 10/2001 | Kimura | 348/308 |
| 2001/0033336 A1 | 10/2001 | Kameshima et al. | 348/300 |
| 2001/0033337 A1 | 10/2001 | Sakuragi | 348/302 |

(Continued)

FOREIGN PATENT DOCUMENTS

CN    1387264 A    12/2002

(Continued)

OTHER PUBLICATIONS http://www.ele.uri.edu/Courses/ele343/lab/lab0/index.html    Mar. 2003 (retrieved by PTO via Wayback Internet archive).

Primary Examiner — David P Porta
Assistant Examiner — Jessica L Eley
(74) Attorney, Agent, or Firm — Fitzpatrick, Cella, Harper & Scinto

(57) ABSTRACT

A photoelectric converting apparatus of the present invention includes a photoelectric converting element, a resetting transistor in which a source is connected to the photoelectric converting element and a drain is connected to a resetting power source, a readout transistor in which a gate is connected to the photoelectric converting element and a drain is connected to a readout power source, a signal line connected to a source of the readout transistor, a selecting transistor connected between the readout power source or the signal line and the readout transistor, and a constant current source connected to the signal line.

15 Claims, 15 Drawing Sheets

U.S. PATENT DOCUMENTS

| | | | |
|---|---|---|---|
| 2002/0079493 A1 | 6/2002 | Horishita | 257/72 |
| 2002/0190215 A1 | 12/2002 | Tashiro et al. | 250/370.11 |
| 2004/0130641 A1* | 7/2004 | Mabuchi | 348/302 |
| 2005/0109927 A1 | 5/2005 | Takenaka et al. | 250/252.1 |
| 2005/0199834 A1 | 9/2005 | Takenaka et al. | 250/580 |
| 2005/0200720 A1 | 9/2005 | Kameshima et al. | 348/220.1 |
| 2005/0212937 A1* | 9/2005 | Koyama | 348/301 |
| 2005/0220269 A1 | 10/2005 | Endo et al. | 378/114 |
| 2005/0220270 A1 | 10/2005 | Kameshima et al. | 378/116 |

FOREIGN PATENT DOCUMENTS

| | | |
|---|---|---|
| EP | 1154310 A2 | 11/2001 |
| EP | 1206125 A2 | 5/2002 |
| JP | 9-252434 | 9/1997 |
| JP | 10-108075 | 4/1998 |
| JP | 2000-324398 | 11/2000 |
| JP | 2001-251555 | 9/2001 |
| JP | 2001-257938 | 9/2001 |
| JP | 2004-298663 | 10/2001 |
| JP | 2002-148342 | 5/2002 |

* cited by examiner

US 7,923,696 B2

PHOTOELECTRIC CONVERTING APPARATUS

RELATED CASES

This application is a divisional of application Ser. No. 10/540,423, filed Jun. 24, 2005, which is the U.S. national phase application of International Application PCT/JP2004/017042, claims benefit of the international application under 35 U.S.C. §120, claims benefit under 35 U.S.C. §119 of Japanese Patent Applications Nos. JP2003-389274, filed on Nov. 19, 2003, and JP2004-180899, filed Jun. 18, 2004, and incorporates the entire contents of each of the mentioned prior applications by reference.

TECHNICAL FIELD

The present invention relates to a photoelectric converting apparatus such as a radiation image pickup apparatus, and more particularly to a photoelectric converting apparatus designed for reducing a sensitivity loss resulting from a parasite capacitance.

BACKGROUND ART

There is already known a photoelectric converting apparatus such as a radiation image pickup apparatus which reads a charge, obtained by a photoelectric conversion in a photoelectric converting element of a sensor array utilizing amorphous silicon or polysilicon, by a transfer to a capacitance by a matrix drive.

FIG. 9 is a schematic circuit diagram showing a prior photoelectric converting apparatus (radiation image pickup apparatus). In the prior photoelectric converting apparatus, as shown in FIG. 9, a pixel indicated by a broken-lined frame includes a PIN photodiode PD and a selecting thin film transistor (TFT) ST, and such pixels are arranged two-dimensionally to constitute a sensor array 101. Such device is constituted for example of an amorphous silicon layer and a polysilicon layer, formed on a glass substrate 102. The PIN diodes PD of the pixels receive, at common electrodes thereof, a bias voltage Vs from a power source.

Also gate electrodes of the selecting TFTs ST of the pixels are connected to common gate lines Vg1-VgM. The common gate lines Vg1-VgM are connected to a gate driver 104 provided with a shift register (not shown). Source electrodes of the selecting TFTs ST of the pixels are connected to common signal lines Sig1-SigN. The common signal lines Sig1-SigN are connected to a readout circuit 103 provided with amplifiers Amp1-AmpN, an analog multiplexer MUX and an A/D converter (not shown).

The prior photoelectric converting apparatus of such structure executes a matrix drive by the gate driver 104, whereby photographed image data are outputted to the readout circuit 103 and are read out.

In the following, there will be explained a cross-sectional structure of a sensor array employed in the prior photoelectric converting apparatus such as a radiation image pickup apparatus. FIG. 10 is a cross-sectional view showing a pixel of a prior photoelectric converting apparatus (X-ray image pickup apparatus).

On a glass substrate 201, in each pixel, a gate electrode layer (lower electrode) 202, an insulation layer (amorphous silicon nitride film) 203, an amorphous silicon semiconductor layer 204, an amorphous n-silicon layer 205, and a source/drain electrode layer (upper electrode) 206 are laminated to constitute a selecting thin film transistor (TFT) 222. Also on the glass substrate, an extended portion (lower electrode) of the source/drain electrode layer 206, an amorphous p-silicon layer 207, an amorphous silicon semiconductor layer 208, an amorphous n-silicon layer 209 and an upper electrode layer 210 are laminated to constitute a photodiode 221. Further on the glass substrate 201, there is present a wiring portion 223 constituted by laminating the insulation layer 203, the amorphous silicon semiconductor layer 204, the amorphous n-silicon layer 205, and the source/drain electrode layer 206. Also a protective layer 211 constituted for example of an amorphous silicon nitride film is so formed as to cover these components, and a phosphor layer 213 is adhered thereon by an adhesive layer 212. Such structure is described for example in Japanese Patent Application Laid-open No. H08-116044.

The phosphor layer 213 is provided for converting a radiation (X-ray) into a visible light. In general, a photodiode formed with amorphous silicon has an extremely low sensitivity to the X-ray. The phosphor layer 213 is constituted for example of a gadolinium-based material or a CsI (cesium iodide).

In such prior photoelectric converting apparatus (X-ray image pickup apparatus), an X-ray transmitted by an object is converted, upon entering the phosphor layer, into a visible light. Then the visible light enters the photodiode. The photodiode generates a charge in the semiconductor layer, and such charges are transferred, when the TFTs are turned on, to the readout circuit in succession and read out.

However, in the prior photoelectric converting apparatus such as the radiation image pickup apparatus, a large parasite capacitance is generated in the common signal line as the number of pixels arranged two-dimensionally increases, thus leading to a significant decrease in the output voltage. More specifically, as shown in FIG. 9, a parasite capacitance Cgs is present between the gate and source electrodes of the selecting TFT ST, and the magnitude of the parasite capacitance associated with a common signal line increases in proportion to the number of pixels connected to such common signal line. For example, in case of preparing an area sensor corresponding to an X-ray film with a size of 40×40 cm by arranging pixels of 200×200 μm each by 2000 units in the longitudinal direction and by 2000 units in the lateral direction, even a parasite capacitance Cgs of 0.05 pF in one location leads to a parasite capacitance of 0.05×2000=100 pF per a common signal line.

On the other hand, the photodiode PD has a sensor capacitance C of about 1 pF. Therefore, for a signal voltage V1 generated in the photodiode in response to the entry of a visible light, an output voltage Vo observable on the common signal line becomes $Vo = V1 \times Cs/(Cs+Cgs) \times 2000$, whereby the output Vo becomes about 1/100 of the signal voltage V1.

Therefore, the prior photoelectric converting apparatus such as the radiation image pickup apparatus cannot be constructed into a sensor of a large area because of such significant loss in the output voltage. Also because of such significant loss in the output voltage, such apparatus is susceptible to the influence of noises generated in the amplifiers of the readout circuit and external noises, whereby a photoelectric converting apparatus of a high sensitivity may be difficult to construct. The influence of such noises may be reduced by providing the readout circuit with a constant current power source or low-noise amplifiers, but such low-noise amplifier, being a special circuit, leads to drawbacks such as an increased cost. Also since such low-noise amplifier generally has a high electric power consumption, the readout circuit will cause an unnegligible heat generation.

DISCLOSURE OF THE INVENTION

An object of the present invention is to provide a photoelectric converting apparatus capable of reducing the influence of noises resulting from a parasite capacitance, and readable with a readout circuit of a simple configuration with a low electric power consumption.

The present inventors, as a result of intensive investigations for resolving the aforementioned drawbacks, have reached the present invention in following embodiments.

A photoelectric converting apparatus of the present invention is characterized in including a photoelectric converting element, a resetting transistor in which a source is connected to the photoelectric converting element and a drain is connected to a resetting power source, a readout transistor in which a gate is connected to the photoelectric converting element and a drain is connected to a readout power source, a signal line connected to a source of the readout transistor, a selecting transistor connected between the readout power source or the signal line and the readout transistor, and a constant current source connected to the signal line.

An X-ray image pickup system of the present invention is characterized in including an aforementioned photoelectric converting apparatus, an X-ray generating apparatus and control means, in which the control means controls functions of the X-ray generating apparatus and the photoelectric converting apparatus to read an X-ray image transmitted by an object.

According to the present invention, it is possible, even in a sensor of a large area, to suppress a loss in the output voltage resulting from an increase in the parasite capacitance. Therefore the sensor is less susceptible to the influence of noises, and can provide a high sensitivity. Also a readout means can be constructed without employing a special circuit such as a low-noise amplifier or a constant current source. Also a readout means can be constructed with a low electric power consumption and with little influence of heat generation. Furthermore, the constant current source employed in the present invention can be formed by a thin film transistor on a glass substrate. Therefore, it can be formed by film formations simultaneously with the photoelectric converting element and other thin film transistors, thus being advantageous in cost. Also the constant current source can be provided in a distant location from the readout means on the glass substrate, thereby alleviating the influence of the resistance of the signal line.

Other features and advantages of the present invention will become apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated and constitute a part of the specification, illustrate embodiments of the invention and, together with the description, serve to explain the principles of the invention.

BEST MODE FOR CARRYING OUT THE INVENTION

In the following, the present invention will be clarified in more details by embodiments thereof, with reference to the accompanying drawings.

First Embodiment

Figure 1:
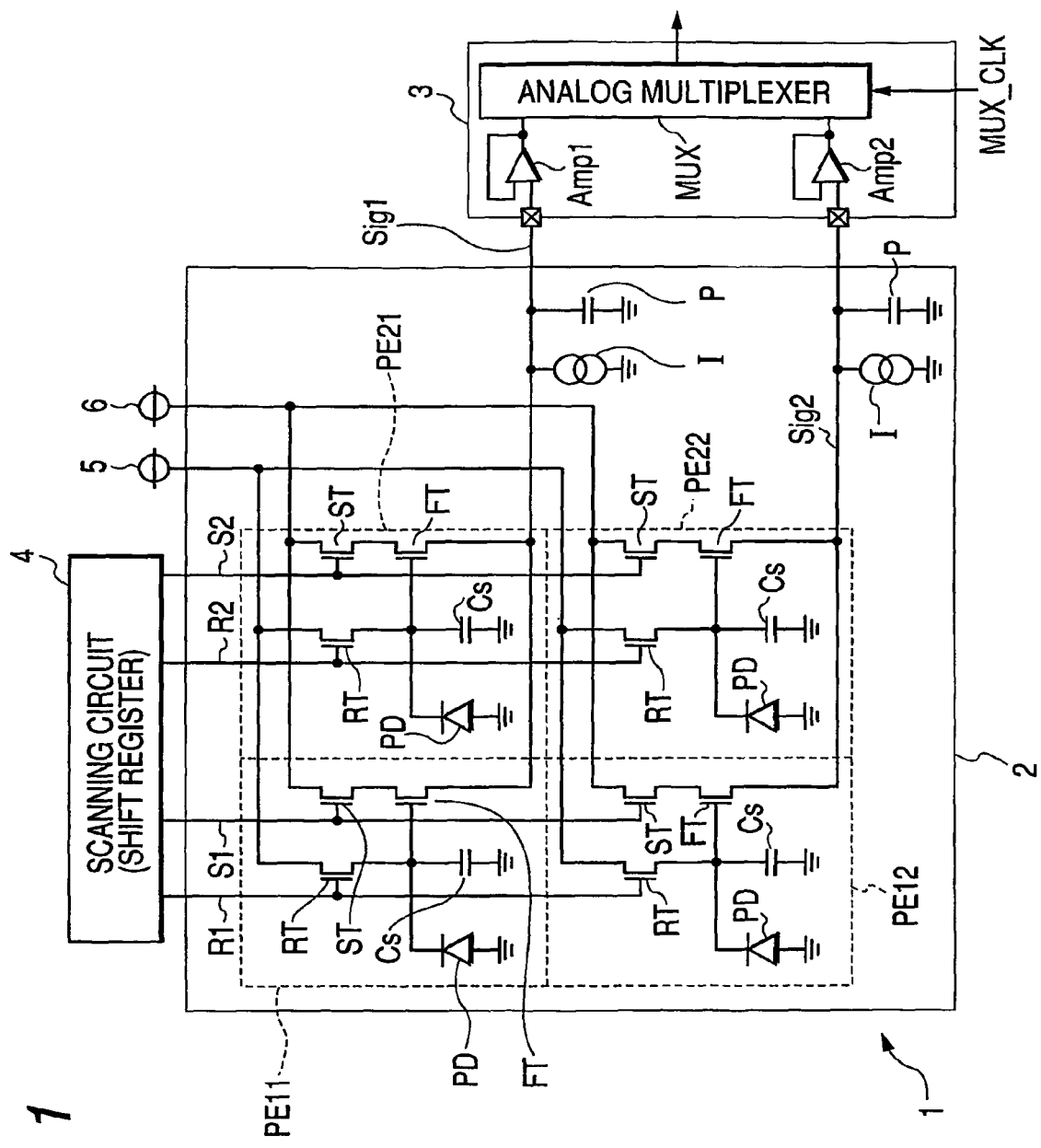
FIG. 1 is a circuit diagram showing a circuit structure of a photoelectric converting apparatus, particularly an X-ray image pickup apparatus, constituting a first embodiment of the present invention.

At first there will be explained a first embodiment of the present invention. FIG. 1 is a circuit diagram showing a circuit structure of a photoelectric converting apparatus, particularly an X-ray image pickup apparatus, constituting the first embodiment of the present invention.

In the present embodiment, a sensor array 1 is constructed on a glass substrate 2, by arranging four pixels PE11, PE12, PE21 and PE22 in two rows and two columns, but a number of pixels constituting the sensor array 1 is not limited to such example. Each pixel is provided with a photoelectric converting element PD constituted of a PIN photodiode formed with amorphous silicon, and a storage capacitance Cs for accumulating a signal charge generated by the photoelectric converting element PD. The photoelectric converting element PD and the storage capacitance Cs are grounded at one terminals thereof and are mutually connected at the other terminals. Each pixel is further provided with a resetting MOS transistor RT, a selecting MOS transistor ST and a source-follower MOS transistor (readout transistor) FT. The resetting MOS transistor RT, the selecting MOS transistor ST and the source-follower MOS transistor FT are constituted of thin film transistors formed for example with amorphous silicon or polysilicon. The storage capacitance Cs may be dispensed with in case the photoelectric converting element PD itself has a sufficiently large capacitance.

A common resetting line R1 is commonly connected to gates of the resetting MOS transistors RT of the pixels PE11 and PE 12, and a common resetting line R2 is commonly connected to gates of the resetting MOS transistors RT of the pixels PE21 and PE 22. Also each resetting MOS transistors RT is connected at one end thereof to a resetting power source 5, and at the other end to the photoelectric converting element PD and the storage capacitance Cs.

A common selecting line S1 is commonly connected to gates of the selecting MOS transistors ST of the pixels PE11 and PE 12, and a common selecting line S2 is commonly connected to gates of the selecting MOS transistors ST of the pixels PE21 and PE 22. Also each selecting MOS transistors ST is connected at one end thereof to a source follower power source (readout power source) 6, and at the other end to a drain of the source follower MOS transistor FT in the same pixel.

A common signal line Sig1 is commonly connected to sources of the source-follower MOS transistors FT of the pixels PE11 and PE 21, and a common signal line Sig2 is commonly connected to sources of the source-follower MOS transistors FT of the pixels PE12 and PE 22. Also a gate of each source-follower MOS transistors FT is connected to the photoelectric converting element PD and the storage capacitance Cs in the same pixel.

The common resetting lines R1 and R2, and the common selecting lines S1 and S2 are connected to a scanning circuit 4 provided with a shift register formed with crystalline silicon. Also the common signal lines Sig1 and Sig2 are connected to a readout circuit 3 formed with crystalline silicon.

Further, the common signal lines Sig1 and Sig2 are connected to a constant current source I formed on the glass substrate 2. The readout circuit 3 is provided with amplifiers Amp1 and Amp2 respectively for the common signal lines Sig1 and Sig2, and also with an analog multiplexer MUX for outputting these output signals in succession to the exterior. The sensor array 1 is provided, on a light receiving surface thereof, with a phosphor layer similar to that in the prior configuration.

Figure 2:
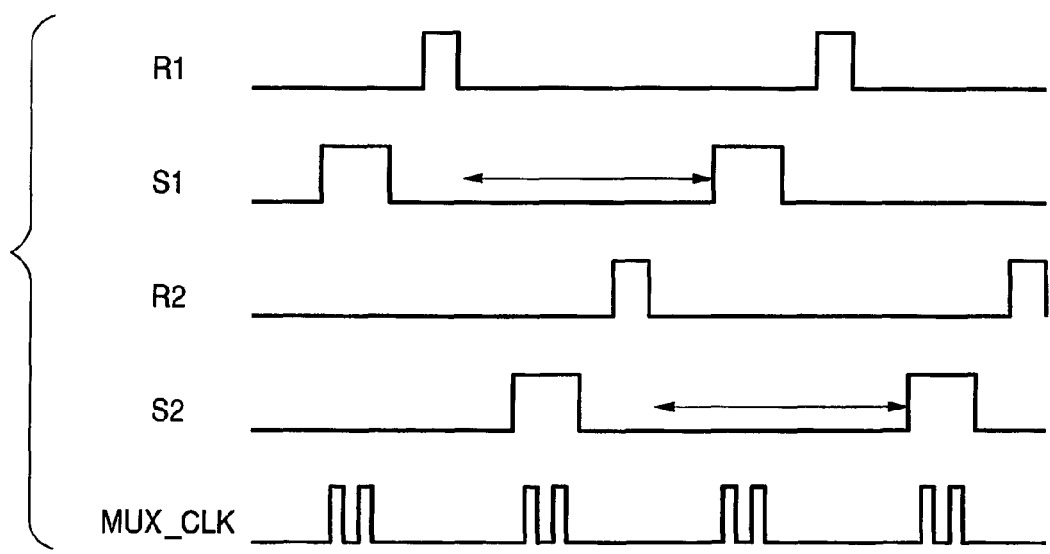
FIG. 2 is a timing chart showing functions of the X-ray image pickup apparatus, constituting the first embodiment.

In the following, functions of the photoelectric converting apparatus (X-ray image pickup apparatus) of the first embodiment will be explained. FIG. 2 is a timing chart showing functions of the photoelectric converting apparatus (X-ray image pickup apparatus) of the first embodiment. In FIG. 2, R1 and R2 indicate resetting pulses respectively applied to the gates of the resetting MOS transistors RT through the resetting lines R1, R2, while S1 and S2 indicate selecting pulses respectively applied to the gates of the selecting MOS transistors ST through the selecting lines S1, S2, and MUX_CLK indicates a pulse supplied to the analog multiplexer MUX.

In a state where an irradiation (X-ray) continuously irradiates the photoelectric converting apparatus, when the scanning circuit 4 applies a resetting pulse to the common resetting line R1, the photoelectric converting elements PD of the pixels PE11 and PE12 are reset in the potential and start a photoelectric conversion, thereby accumulating charges in the storage capacitances Cs. Also when the scanning circuit 4 applies a resetting pulse to the common resetting line R2, the photoelectric converting elements PD of the pixels PE21 and PE22 are reset in the potential and start a photoelectric conversion, thereby accumulating charges in the storage capacitances Cs.

Then, when the scanning circuit 4 applies a selecting pulse to the common selecting line S1, after the application of the resetting pulse to the common resetting line R1, the signal charges accumulated in the storage capacitances Cs of the pixels PE11 and PE 12 after the resetting of the photoelectric converting elements PD are read out through the signal line Sig1 to the readout circuit 13. Similarly, when the scanning circuit 4 applies a selecting pulse to the common selecting line S2, after the application of the resetting pulse to the common resetting line R2, the signal charges accumulated in the storage capacitances Cs of the pixels PE21 and PE 22 after the resetting of the photoelectric converting elements PD are read out through the signal line Sig2 to the readout circuit 13.

The readout circuit 3 outputs, in synchronization with the pulses MUX_CLK, the signals supplied through the signal lines Sig1 and Sig2 to an external processing apparatus or the like.

In such first embodiment, the entire circuit has a source-follower circuit structure. Therefore the signals obtained in the photoelectric converting elements PD can be amplified and read out without being influenced by the parasite capacitances P on the signal lines Sig1 and Sig2. It is therefore possible to avoid an output loss resulting from a large sensor area formation. There can also be obtained an effect that the output is less susceptible to the noises generated in the amplifiers Amp1, Amp2 themselves in the readout circuit or external noises. A high sensitivity can thus be obtained. Furthermore, as the signal obtained by the photoelectric converting element PD is amplified by a source follower and the readout circuit 3 does not require a constant current source, the readout circuit 3 can have a simple configuration and can be constructed with inexpensive general-purpose elements. Thus the readout circuit can be realized with a simple structure not requiring special components such as a low-noise amplifier of a high electric power consumption or a constant current source, which are necessary in the prior technology.

In the foregoing description of the functions, the radiation (X-ray) is assumed to irradiate continuously, but the irradiation may also be intermittent. Also in the structure of the X-ray image pickup apparatus, the selecting MOS transistor may be provided at the side of the source of the source-follower MOS transistor. Also the constant current source is not particularly restricted in the circuit configuration and can be constituted with one or more TFTs.

Second Embodiment

Figure 3:
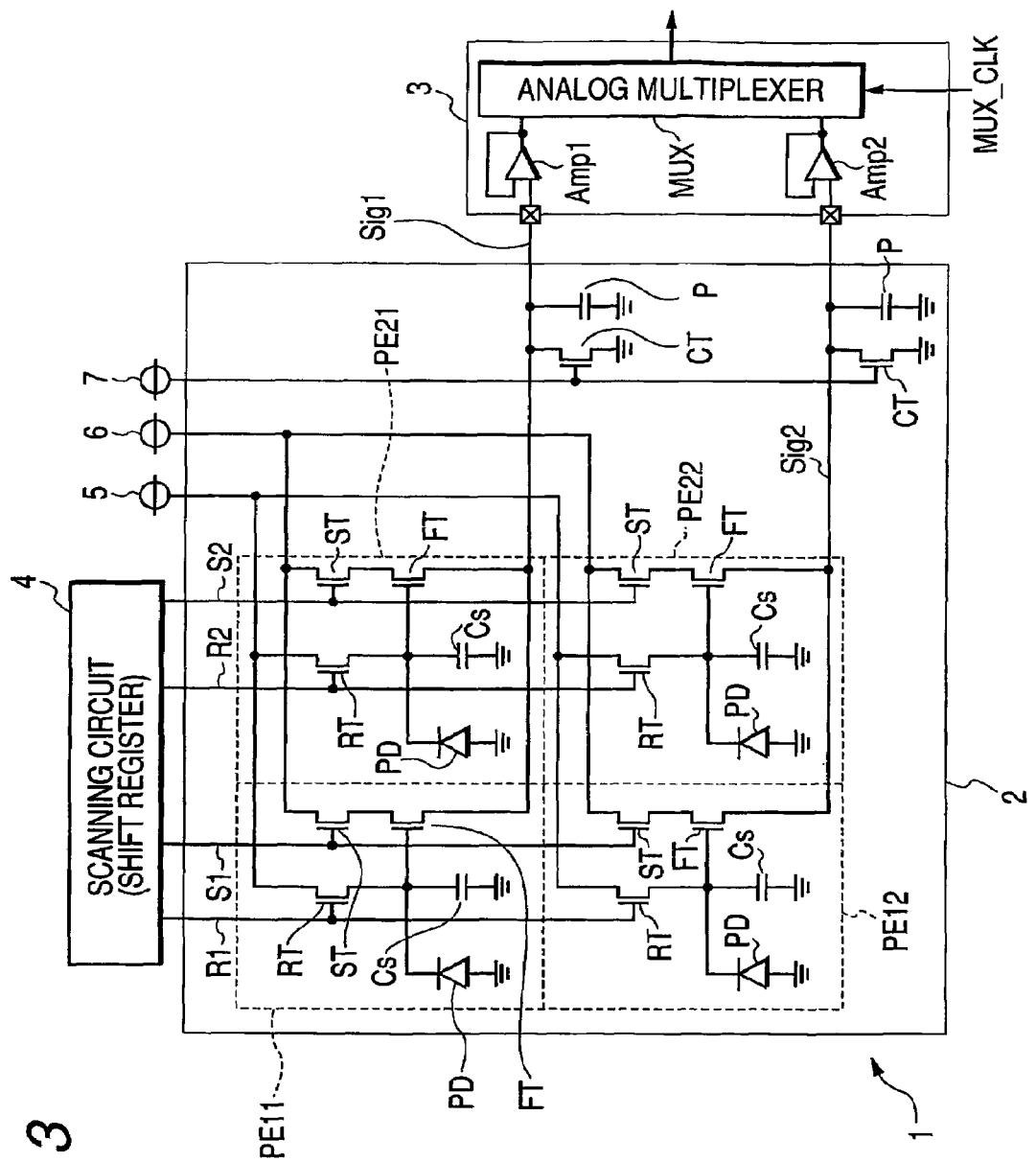
FIG. 3 is a circuit diagram showing a circuit structure of a photoelectric converting apparatus, particularly an X-ray image pickup apparatus, constituting a second embodiment of the present invention.

In the following, there will be explained a second embodiment of the present invention. FIG. 3 is a circuit diagram showing a circuit structure of a photoelectric converting apparatus, particularly an X-ray image pickup apparatus, constituting a second embodiment of the present invention. In the second embodiment, in place for the constant current source I employed in the first embodiment, a thin film transistor (TFT) CT formed by amorphous silicon is provided. A gate of the thin film transistor CT receives a voltage from a power supply 7 for a constant current source. Such structure can be produced by a simple manufacturing process, as the constant current source can be simultaneously formed by film formations with other transistors (resetting, selecting and source follower). The thin film transistors for resetting, for selecting, for source follower and for constant current source may have same laminated film thicknesses or individually different film thicknesses. They may also have common impurity doping conditions (n type or p type) or individually different doping conditions. Furthermore, they may be formed with amorphous silicon in a part and polysilicon in another part, utilizing for example laser annealing.

Figure 11:
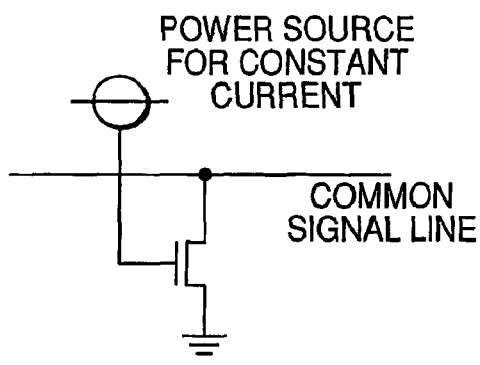
FIG. 11 is a circuit diagram showing a configuration of a constant current source.

In FIG. 3, the constant current source having the thin film transistor CT and the power supply 7 for the constant current source is constructed as shown in FIG. 11. In this case, the thin film transistor CT constituting the constant current source may be of n-type or p-type.

Figure 4:
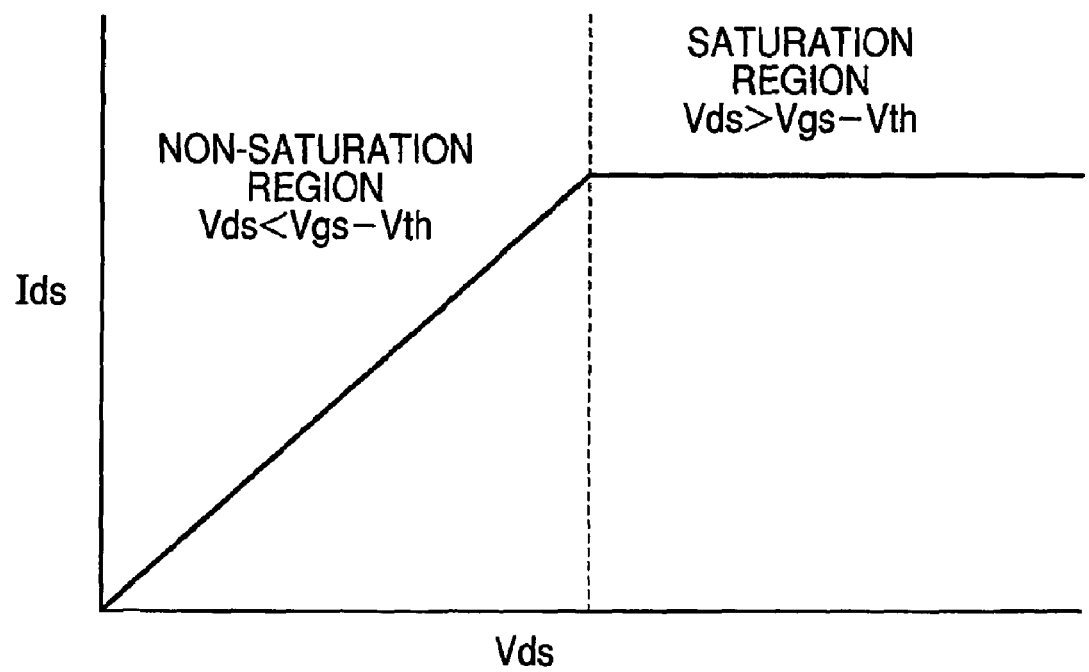
FIG. 4 is a chart showing Vds-Ids characteristics of a thin film transistor CT in the second embodiment.

In case the thin film transistor CT is for example an n-type thin film transistor, the thin film transistor CT shows Vds-Ids characteristics as shown in FIG. 4, with respect to a source-drain voltage Vds, a source-drain current Ids, a gate-source voltage Vgs and a threshold voltage Vth. Therefore, the thin film transistor CT can be utilized as a constant current source by controlling the gate voltage of the thin film transistor CT so as to bring it to a saturation region satisfying a relation (Vds>Vgs−Vth).

Figure 12:
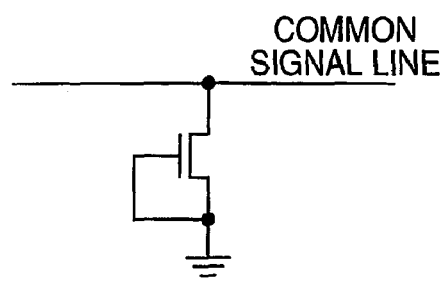
FIG. 12 is a circuit diagram showing another configuration of a constant current source.
Figure 13:
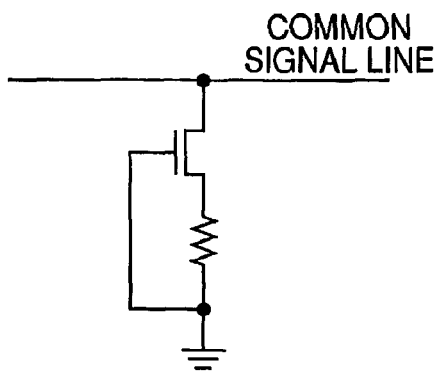
FIG. 13 is a circuit diagram showing still another configuration of a constant current source.

Also according to the aforementioned relationship, in case the thin film transistor is n-type, the constant current source can be realized with a simple structure by mutually connecting the gate and the source as shown in FIG. 12. Also depending upon the required current, a resistor may be provided between the gate and the source as shown in FIG. 13. The configuration shown in FIG. 12 or 13 allows to dispense with the power supply for the constant current source.

Figure 14:
FIG. 14 is a circuit diagram showing still another configuration of a constant current source.

Also another example of the constant current source formed on the glass substrate is shown in FIG. 14. In this example, a pseudo constant current source is formed by a resistor patterned on the glass substrate, without employing a thin film transistor or the like. The resistance in this case is preferably sufficiently larger than an on-resistance of the selecting MOS transistor.

Third Embodiment

Figure 5:
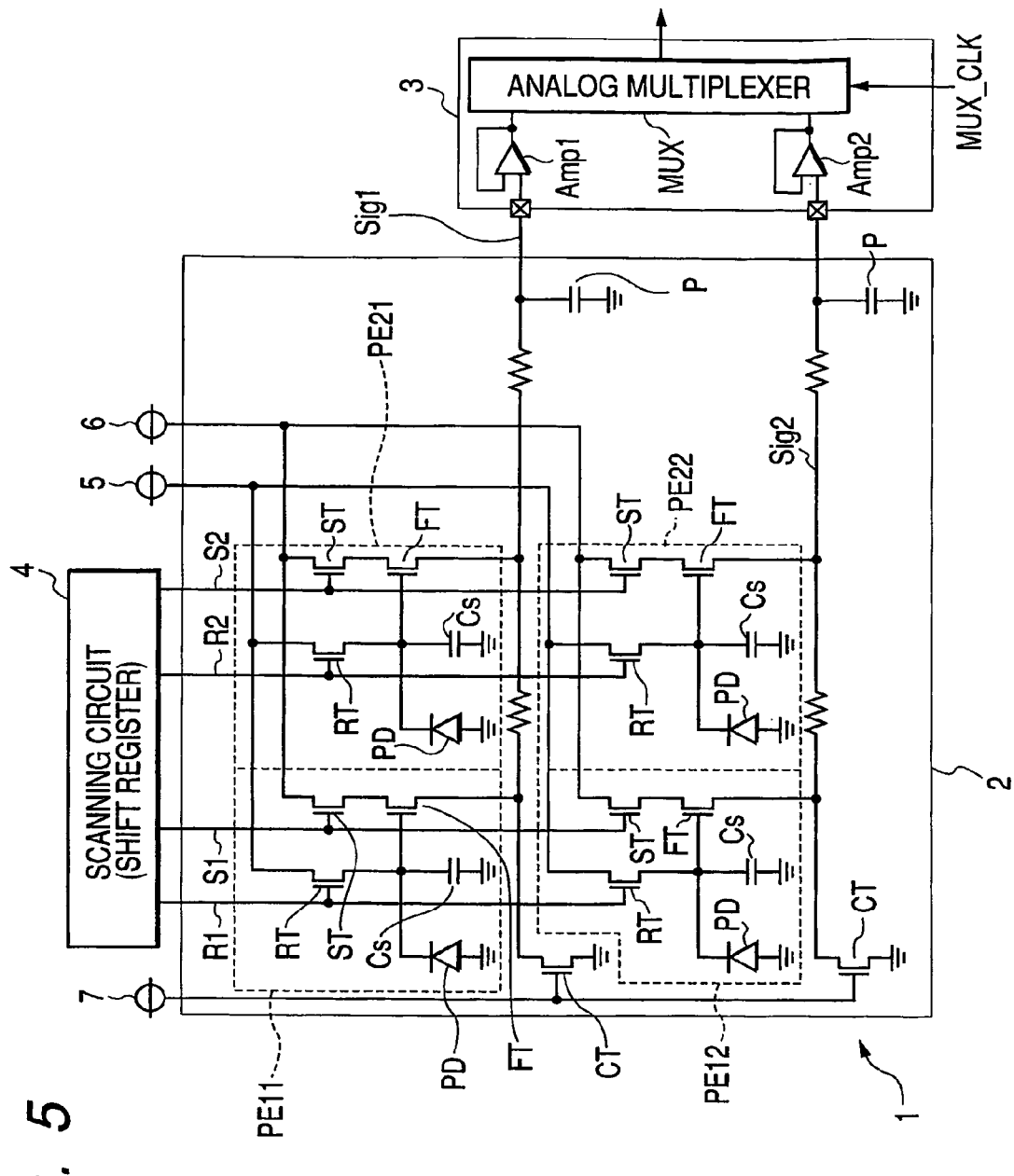
FIG. 5 is a circuit diagram showing a circuit structure of a photoelectric converting apparatus, particularly an X-ray image pickup apparatus, constituting a third embodiment of the present invention.

In the following, there will be explained a third embodiment of the present invention. FIG. 5 is a circuit diagram showing a circuit structure of a photoelectric converting apparatus, particularly an X-ray image pickup apparatus, constituting a third embodiment of the present invention. In contrast to the second embodiment in which the thin film transistor CT constituting the constant current source is positioned between a pixel and the readout circuit 3, in the third embodiment, the thin film transistor CT is located, on the common signal line, at a position more spaced from the readout circuit 3 than the pixel. Stated differently, the pixel is positioned between the thin film transistor CT and the readout circuit 3.

Figure 15:
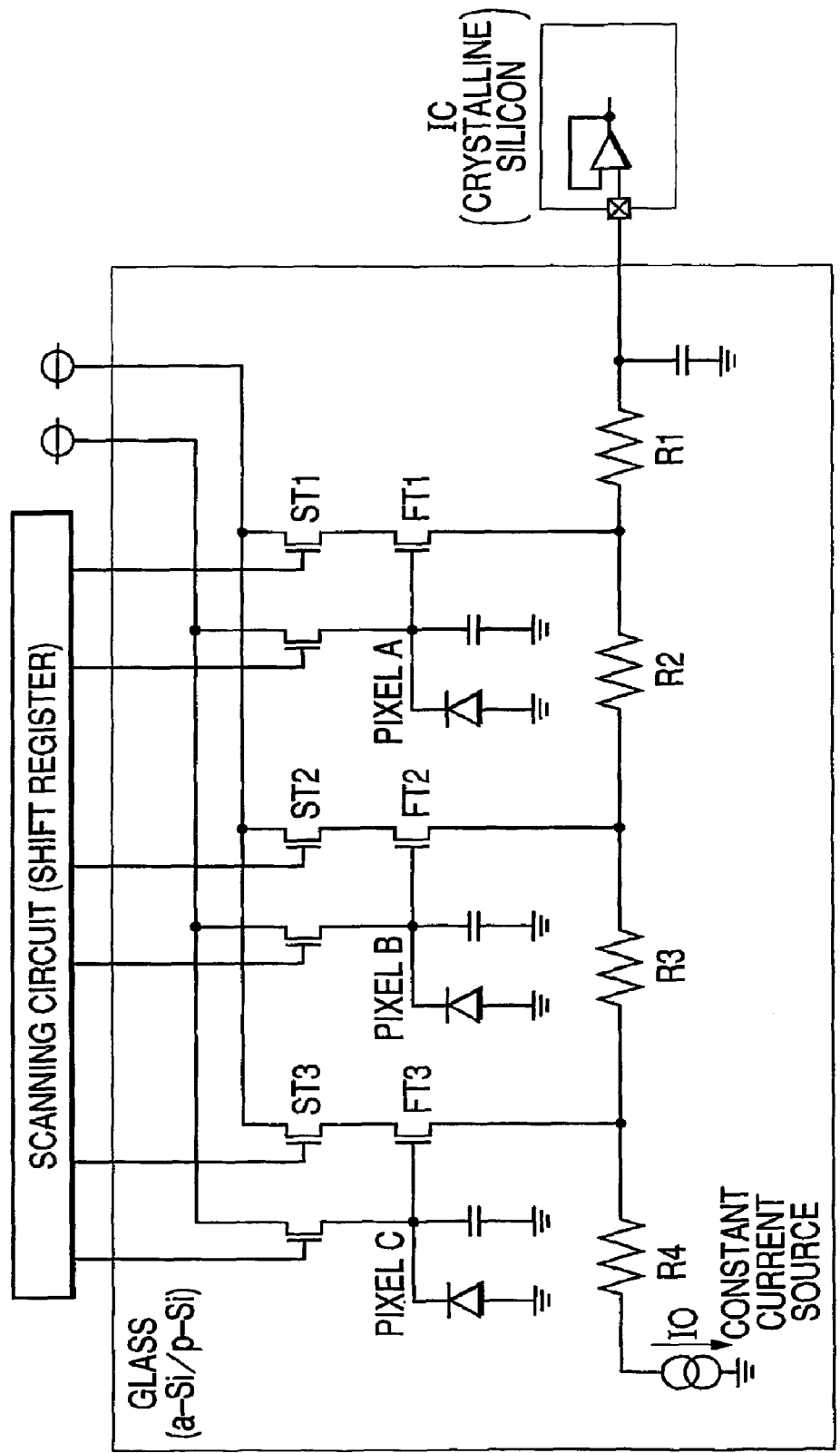
FIG. 15 is a view showing an output by an arrangement (spaced arrangement) of the constant current source.
Figure 16:
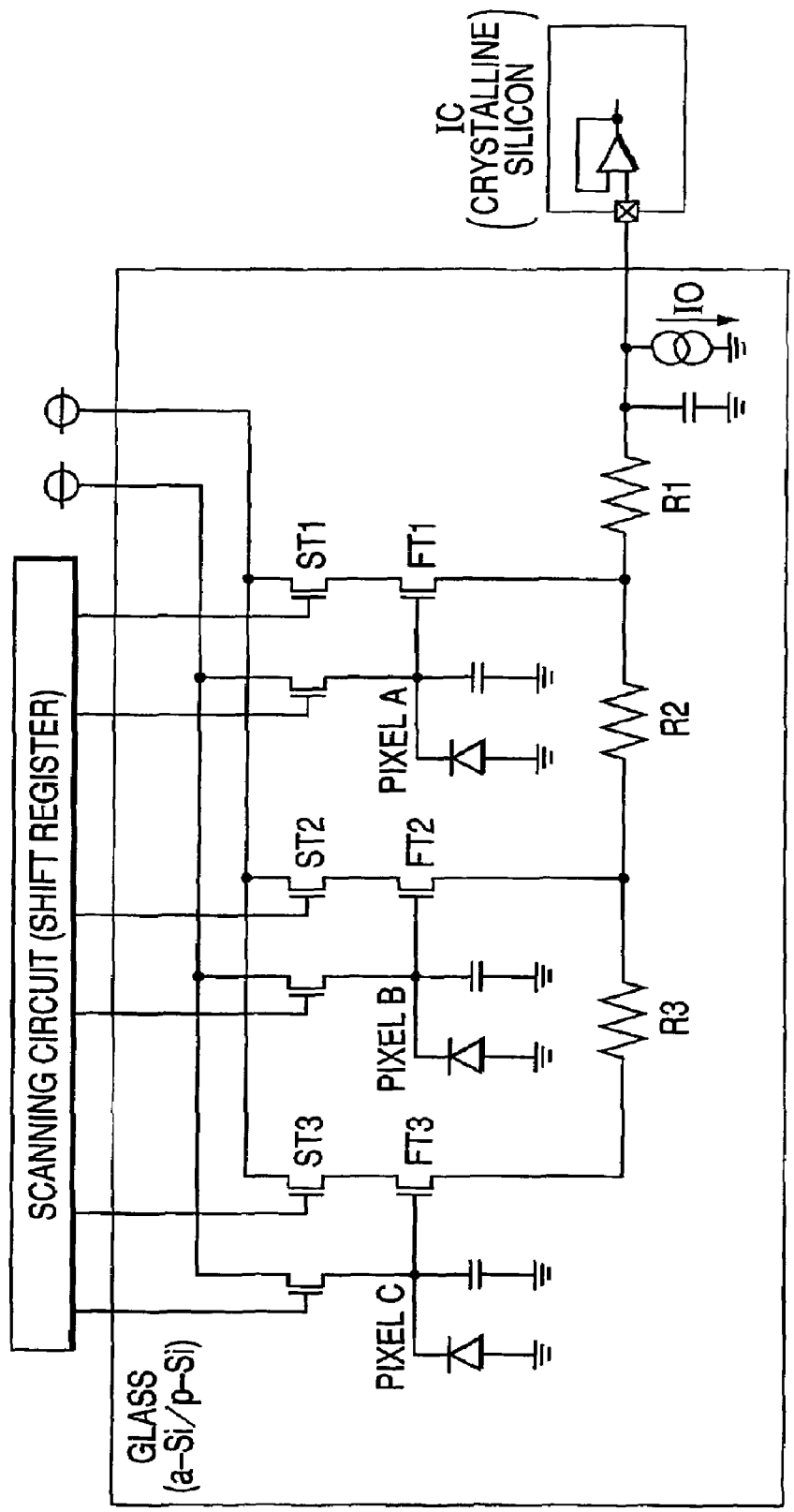
FIG. 16 is a view showing an output by an arrangement (arrangement at readout means side) of the constant current source.
Figure 17:
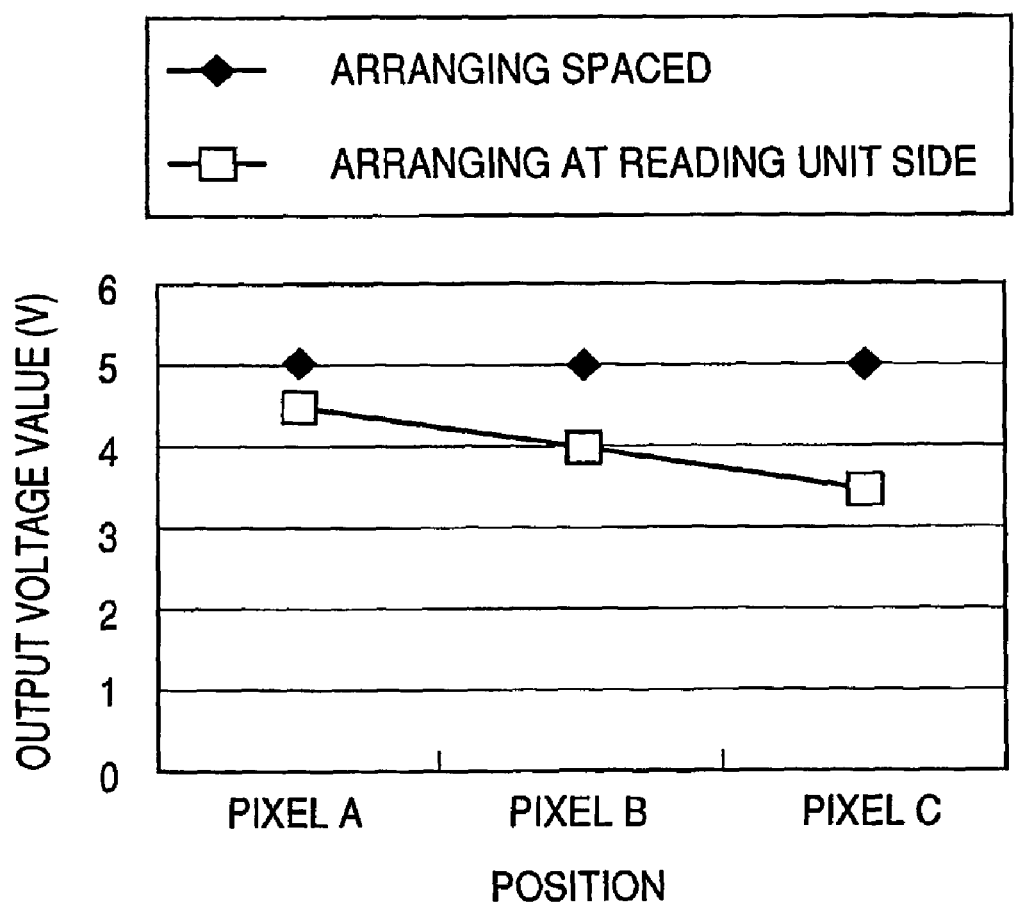
FIG. 17 is a view showing an output difference by the arrangement of the constant current source.

An advantage of a spaced arrangement of the constant current source from the readout circuit will be explained with reference to FIGS. 15, 16 and 17. FIG. 15 shows a structure in which, for each signal line, the constant current source is spaced from the readout means, and FIG. 16 shows a structure in which the constant current source is positioned at the side of the readout means. In case the constant current source is provided at the side of the readout means as shown in FIG. 16, a voltage Vout actually read out by the readout means is lowered from the source potential Vs of each source follower MOS transistor by resistance components R1, R2 and R3 of the signal line. For example, in case of reading out a pixel C, there is read a voltage lower than the source potential of the FT3 by ΔV=I0×(R1+R2+R3).

Such voltage drop is unnegligible in case the signal line has a large resistance, for example when a photoelectric converting apparatus of a large area is constructed. FIG. 17 shows a state of voltage drop by the pixel. On the other hand, a spaced arrangement of the constant current source from the readout means allows to avoid the drop in the output voltage resulting from the resistance of the signal line. For example, also in case of reading the pixel C, a current scarcely flows in the resistance components R1, R2 and R3, so that the source voltage of the source follower MOS transistor can be read by the readout means almost without a voltage drop. FIG. 17 also shows the voltage drop is scarce when the constant current source is spaced from the readout means. The spaced arrangement of the constant current source from the readout means as shown in FIGS. 5 and 15 allows to avoid the drawback such as the voltage drop even in case the resistance of the signal line is not negligible as in a photoelectric converting apparatus of a large area.

The present embodiment can further provide, in addition to the effects obtained in the first and second embodiments, an effect of avoiding a voltage drop on the signal output, to be read by the readout circuit 3, resulting from a resistance component even when such resistance component is present in the common signal line.

Fourth Embodiment

Figure 6:
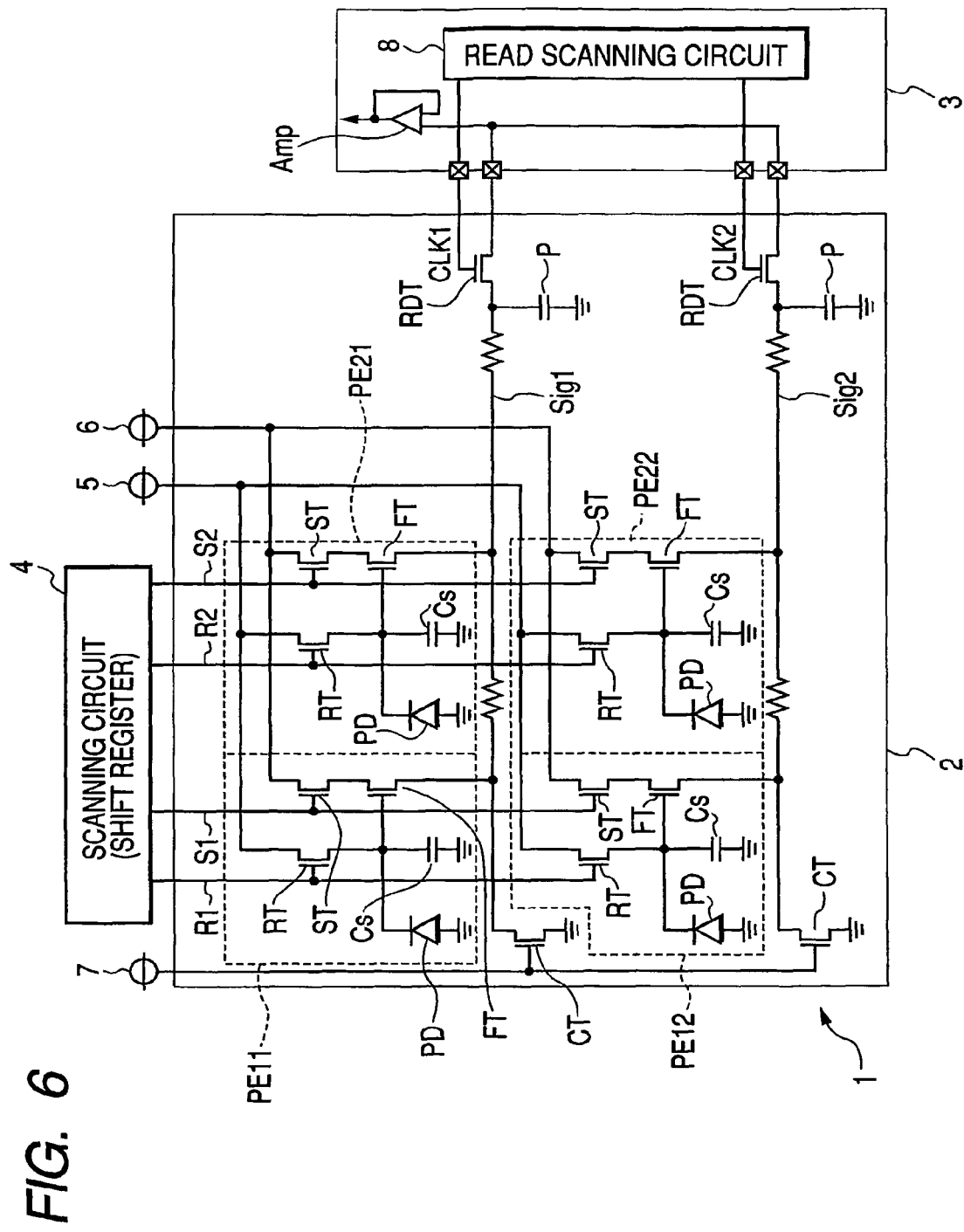
FIG. 6 is a circuit diagram showing a circuit structure of a photoelectric converting apparatus, particularly an X-ray image pickup apparatus, constituting a fourth embodiment of the present invention.

In the following, there will be explained a fourth embodiment of the present invention. FIG. 6 is a circuit diagram showing a circuit structure of a photoelectric converting apparatus, particularly an X-ray image pickup apparatus, constituting a fourth embodiment of the present invention. In contrast to the third embodiment, the fourth embodiment is provided with a readout scanning thin film transistor (TFT) RDT in each of the common signal lines Sig1, Sig2. The readout scanning thin film transistor RDT is formed between the pixel on the glass substrate 2 and the readout circuit 3. Also the readout circuit 3 is not provided with the analog multiplexer MUX and the output signals from the signal lines are entered into a single amplifier Amp. The readout circuit 3 is further provided with a readout scanning circuit 8 for scan controlling the gate voltages of the readout scanning thin film transistors RDT.

Figure 7:
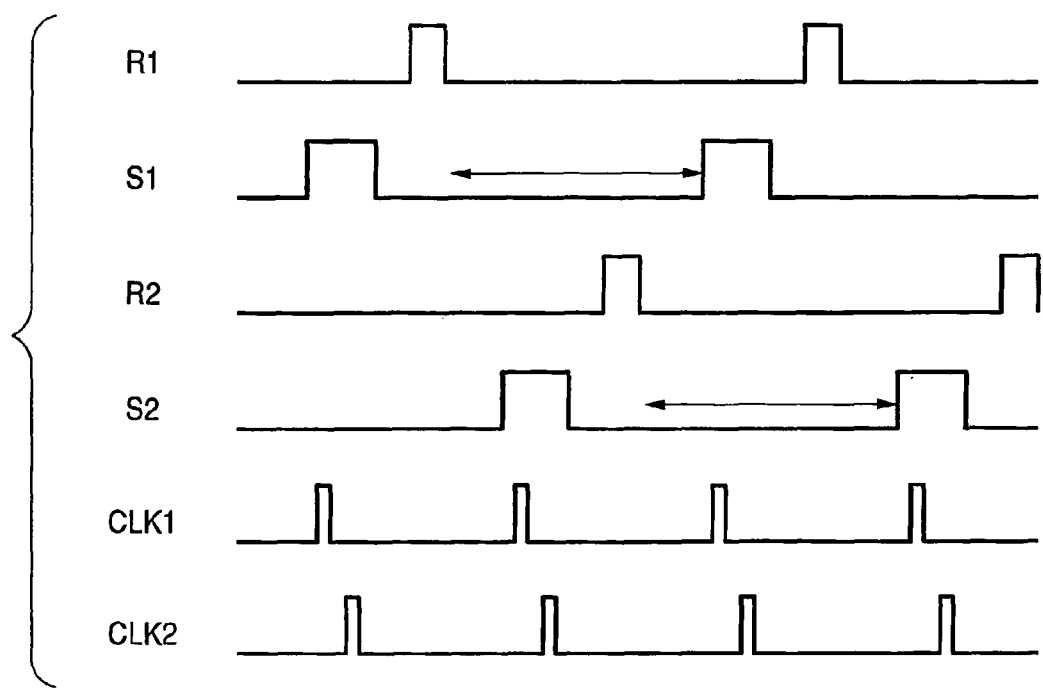
FIG. 7 is a timing chart showing functions of the X-ray image pickup apparatus, constituting the fourth embodiment.

In the fourth embodiment of the aforementioned structure, after the signal charges are accumulated in the storage capacitances Cs as in the first embodiment, the readout scanning thin film transistors RDT are turned on in synchronization with a clock signal CLK1 for the signal line Sig1 and a clock signal CLK2 for the signal line Sig2 as shown in FIG. 7, whereby the accumulated charges are read out in succession to the readout circuit 3.

In such fourth embodiment, the readout circuit 3 only requires an amplifier and other necessary logic circuits and is thus further simplified in structure, whereby the noises are further reduced and a higher sensitivity can be obtained with a simpler configuration. In the present embodiment, in consideration of the scanning speed, the scanning thin film transistors RDT are preferably formed by polysilicon, utilizing for example a laser annealing method.

Fifth Embodiment

Figure 8:
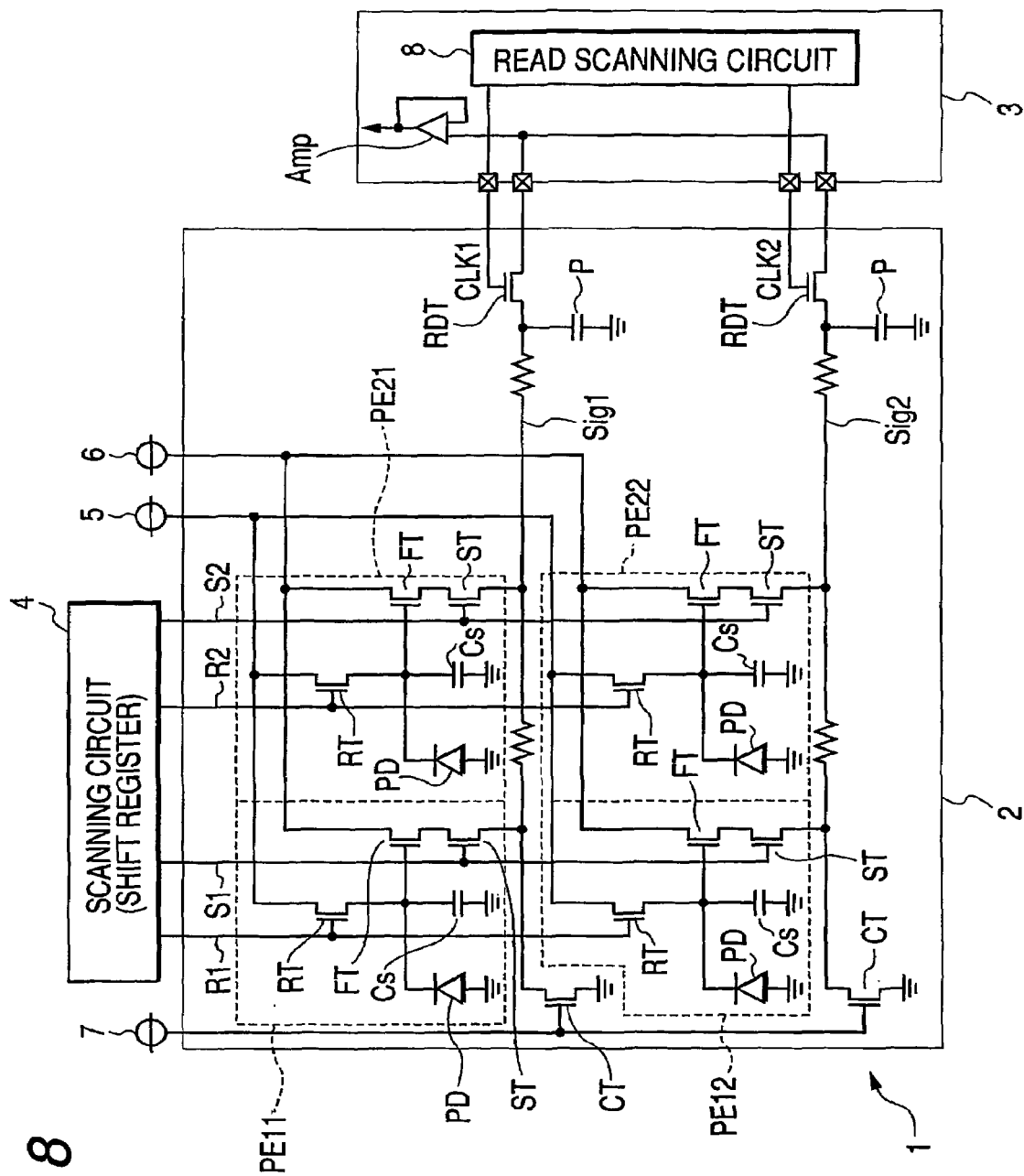
FIG. 8 is a circuit diagram showing a circuit structure of a photoelectric converting apparatus, particularly an X-ray image pickup apparatus, constituting a fifth embodiment of the present invention.
Figure 9:
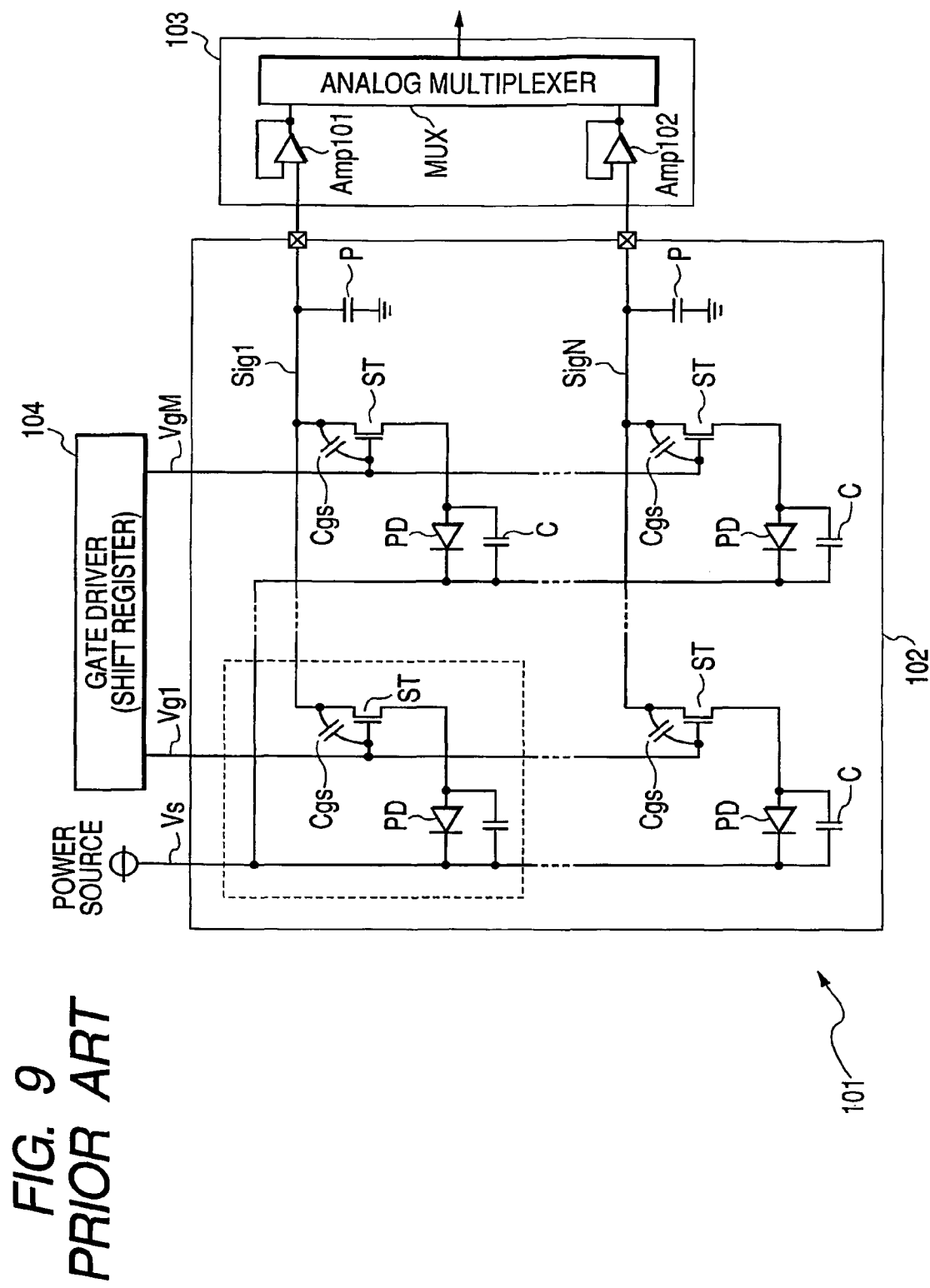
FIG. 9 is a schematic circuit diagram showing a prior photoelectric converting apparatus (radiation image pickup apparatus).
Figure 10:
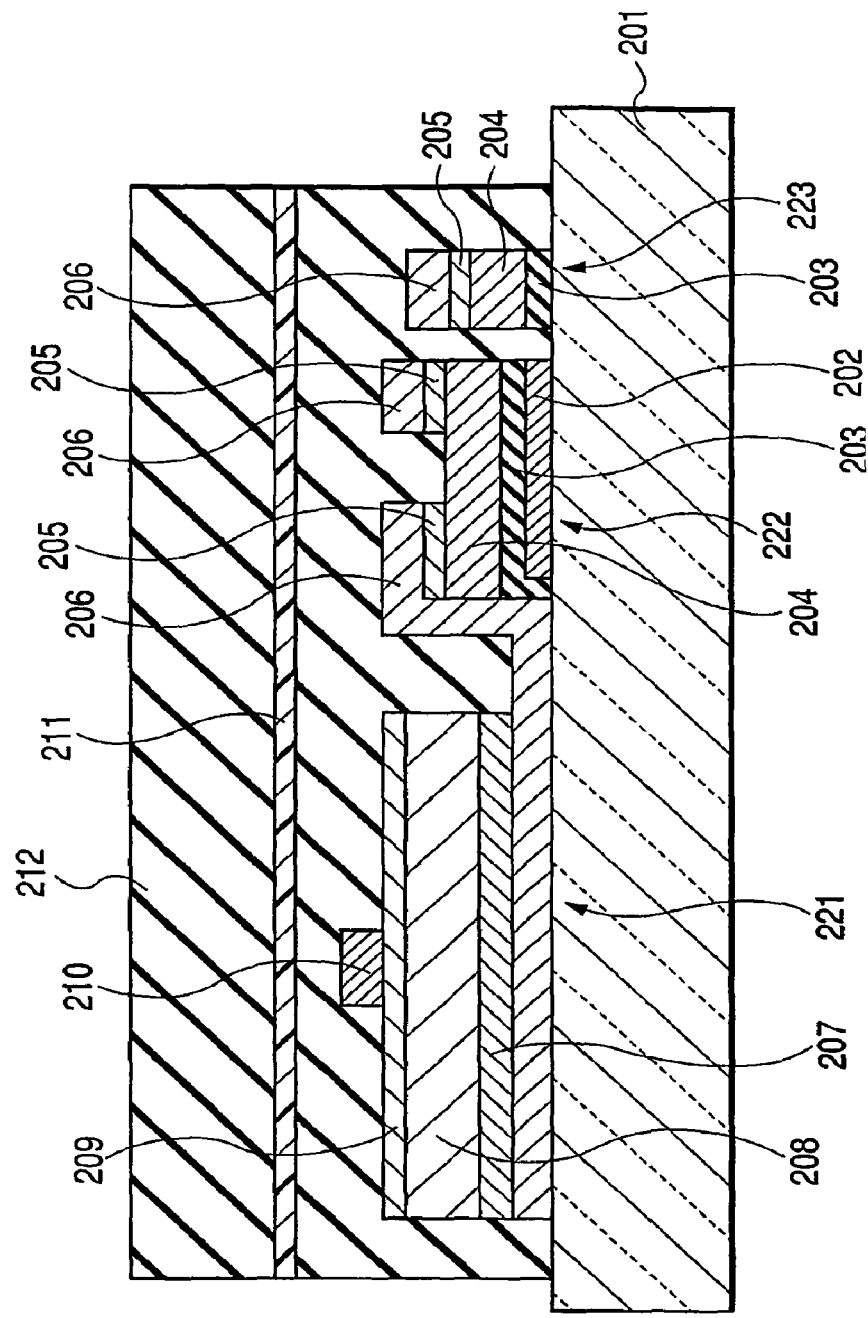
FIG. 10 is a cross-sectional view showing a pixel of a prior photoelectric converting apparatus (X-ray image pickup apparatus).

In the following, there will be explained a fifth embodiment of the present invention. FIG. 8 is a circuit diagram showing a circuit structure of a photoelectric converting apparatus, particularly an X-ray image pickup apparatus, constituting a fifth embodiment of the present invention. In contrast to the fourth embodiment in which the selecting MOS transistor ST is connected to the drain of the source follower MOS transistor FT, in the fifth embodiment, the selecting MOS transistor ST is connected between the source of the source follower MOS transistor FT and the signal line Sig1 or Sig2. The drain of the source follower MOS transistor FT is directly connected to the source follower power source 6.

Such fifth embodiment can provide an effect similar to that of the fourth embodiment.

The apparatus is not limited to the X-ray detection but may directly receive a visible light, without providing the phosphor layer. Also the photoelectric converting element is not limited to a PIN photodiode but may also be constituted of a MIS sensor. In case of utilizing a MIS sensor, there may also be employed a configuration in which the resetting power source connected to the resetting transistors can control the output voltage by unillustrated control means.

Further, the photoelectric converting element may be so-called direct converting element based on a material capable of directly absorbing a radiation (or X-ray) and generating a charge, such as amorphous selenium, gallium arsenide, lead iodide or mercury iodide. In such case, the photoelectric converting element can be constructed by forming or connecting such direct converting element on a glass substrate on which the thin film transistors are formed with amorphous silicon or polysilicon.

Sixth Embodiment

Figure 18:
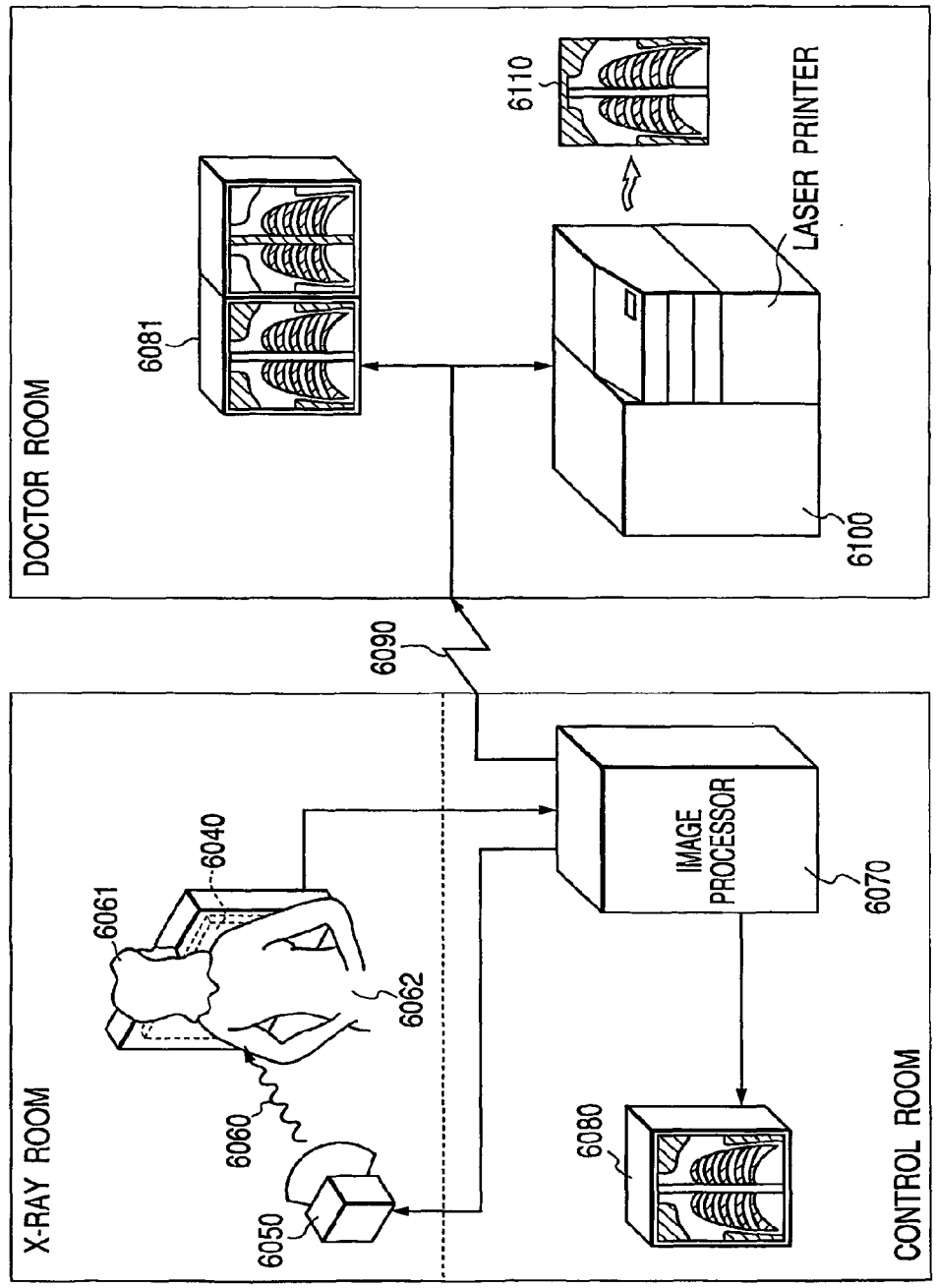
FIG. 18 is a view showing an X-ray image photographing system utilizing a photoelectric converting apparatus of the present invention.

In the following, there will be explained a sixth embodiment of the present invention, which is an X-ray image pickup system utilizing the photoelectric converting apparatus of the present invention. FIG. 18 illustrates an X-ray image pickup system of the sixth embodiment of the present invention.

In an X-ray room (image pickup room), an X-ray 6060 generated by an X-ray tube (X-ray generating apparatus) 6050 is transmitted by a chest 6062 of a patient or an inspected person 6061 and enters an image sensor 6040. The entering X-ray contains information of the interior of the body of the patient 6061. In response to the X-ray entry, a scintillator (phosphor) generates a light, which is photoelectrically converted by photoelectric converting elements of a sensor panel to obtain electrical information. The image sensor 6040 outputs such information as an electrical signal (digital signal) to an image processor 6070. The image processor 6070, serving as image processing means, applies an image processing on the received signal and outputs it to a display 6080 constituting display means in a control room (operation room). Thus a user can obtain information on the interior of the body of the patient 6061, by observing the image displayed on the display 6080. The image processor 6070 also has a control function, and can switch moving/still image modes or can control the X-ray tube 6050.

Also the image processor 6070 is capable of transferring the electrical signal, outputted from the image sensor 6040, to a distant location through transmission means such as a telephone line 6090, for display on display means 6081 in another location such as a doctor room. It can also store the electrical signal from the image sensor 6040 in recording means such as an optical disk, which can be utilized for a diagnosis by a doctor in another location. The signal can also be recorded on a film 6110 by a film processor 6100 constituting recording means.

The present X-ray image pickup system is featured by following points:
(1) The aforementioned photoelectric converting apparatus is provided in the image sensor 6040, and the A/D converted digital output is subjected to a suitable image processing by the image processor 6070; and
(2) The image processor 6070 is provided with unillustrated control means, which controls the image sensor 6040, the X-ray generating apparatus 6050, the displays 6080, 6081, the film processor 6100 etc.

As many apparently widely different embodiments of the present invention can be made without departing from the spirit and scope thereof, it is to be understood that the invention is not limited to the specific embodiments thereof except as defined in the claims.

This application claims priority from Japanese Patent Application Nos. 2003-389274 filed on Nov. 19, 2003 and 2004-180899 filed on Jun. 18, 2004, which are hereby incorporated by reference herein.

The invention claimed is:

1. A photoelectric converting apparatus comprising:
an insulating supporting substrate that comprises
a pixel including a photoelectric converting element, a resetting transistor having a source and a drain, wherein one of the source and the drain is connected to said photoelectric converting element and the other of the source and the drain is connected to a resetting power source, a readout transistor having a source, a drain and a gate, wherein the gate is connected to said photoelectric converting element and one of the source and the drain of said readout transistor is electrically connected to a readout power source,
a signal line connected electrically to the other of the source and the drain of said readout transistor, and
a constant current source connected to said signal line, wherein the resetting transistor, the readout transistor, and the constant current source are formed from an amorphous silicon layer or a polysilicon layer; and
a readout unit connected to said signal line, wherein the readout unit has an amplifier connected to the signal line, and
wherein said constant current source is provided at a position on said insulating supporting substrate, spaced from said readout unit rather than said pixel, and is formed together with at least one of said resetting transistor and said readout transistor.

2. A photoelectric converting apparatus according to claim 1, wherein said readout unit is formed from crystalline silicon, and further has an analog multiplexer connected to said amplifier.

3. A photoelectric converting apparatus according to claim 1, wherein said pixel comprises further a selecting transistor connected between the one of the source and the drain of said readout transistor and said readout power source, or between the one of the source and the drain of said readout transistor and said signal line.

4. A photoelectric converting apparatus according to claim 3, wherein said constant current source includes a constant current source transistor of which a gate is connected to a power supply for the constant current source.

5. A photoelectric converting apparatus according to claim 4, wherein said power supply for the constant current source provides the gate of said constant current source transistor with a voltage satisfying a relation: Vds>Vgs−Vth, wherein Vds is a drain-source voltage, Vgs is a gate-source voltage and Vth is a threshold voltage.

6. A photoelectric converting apparatus according to claim 1, wherein said constant current source includes a constant current source transistor in which a gate and a source are mutually connected.

7. A photoelectric converting apparatus according to claim 1, wherein said constant current source includes a constant current source transistor in which a gate and a source are connected through a resistor.

8. A photoelectric converting apparatus according to claim 1, further comprising a phosphor layer which absorbs radiation and emits light of a wavelength region detectable by said photoelectric converting element.

9. A photoelectric converting apparatus according to claim 1, wherein said photoelectric converting element is constituted of a PIN photodiode or a MIS sensor.

10. A photoelectric converting apparatus according to claim 1, wherein said photoelectric converting element is a direct photoelectric converting element which directly converts a radiation into a charge.

11. A photoelectric converting apparatus according to claim 10, wherein said direct photoelectric converting element is constituted of a material selected from a group consisting of amorphous selenium, gallium arsenide, gallium phosphide, lead iodide, mercury iodide, CdTe and CdZnTe.

12. An X-ray image pickup system for reading an image of X-rays transmitted through an object comprising:
a photoelectric converting apparatus according to claim 1;
an X-ray generating apparatus; and
a control unit,
wherein said control unit controls operations of the X-ray generating apparatus and the photoelectric converting apparatus.

13. A photoelectric converting apparatus comprising:
an insulating supporting substrate comprising
a sensor array including a plurality of pixels arranged two dimensionally, each pixel including a photoelectric converting element, a resetting transistor having a source and a drain, wherein one of the source and the drain is connected to said photoelectric converting element and the other of the source and the drain is connected to a resetting power source, a readout transistor having a source, a drain and a gate, wherein the gate is connected to said photoelectric converting element and one of the source of said readout transistor and the drain of said readout transistor is electrically connected to a readout power source,
a plurality of signal lines connected electrically and commonly to the others of the sources and the drains of said readout transistors, and
a constant current source connected to said signal lines, wherein the resetting transistor, the readout transistor, and the constant current source are formed from an amorphous silicon layer or a polysilicon layer; and
a readout unit connected to said signal lines, wherein the readout unit has an amplifier connected to the signal line, and
wherein said constant current source is provided at a position on said insulating supporting substrate, spaced from said readout unit rather than said sensor array, and is formed together with at least one of said resetting transistors and said readout transistors.

14. A photoelectric converting apparatus according to claim 13, wherein said readout unit is formed from crystalline silicon, and further has an analog multiplexer connected to said amplifier.

15. An X-ray image pickup system for reading an image of X-rays transmitted through an object comprising:
a photoelectric converting apparatus according to claim 13;
an X-ray generating apparatus; and
a control unit,
wherein said control unit controls operations of the X-ray generating apparatus and the photoelectric converting apparatus.

* * * * *